(12) United States Patent
Feichtinger et al.

(10) Patent No.: US 9,177,703 B2
(45) Date of Patent: Nov. 3, 2015

(54) ELECTRIC COMPONENT ASSEMBLY

(75) Inventors: Thomas Feichtinger, Graz (AT);
Guenter Engel, Leibnitz (AT); Axel Pecina, St. Martin (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/994,146

(22) PCT Filed: May 22, 2009

(86) PCT No.: PCT/EP2009/056247
§ 371 (c)(1),
(2), (4) Date: Feb. 16, 2011

(87) PCT Pub. No.: WO2009/141437
PCT Pub. Date: Nov. 26, 2009

(65) Prior Publication Data
US 2011/0188161 A1 Aug. 4, 2011

(30) Foreign Application Priority Data
May 21, 2008 (DE) .......................... 10 2008 024 479

(51) Int. Cl.
| H02H 1/00 | (2006.01) |
| H01C 7/12 | (2006.01) |
| H01C 7/10 | (2006.01) |
| H01C 7/102 | (2006.01) |
| H01C 7/105 | (2006.01) |

(52) U.S. Cl.
CPC .. *H01C 7/12* (2013.01); *H01C 7/10* (2013.01); *H01C 7/102* (2013.01); *H01C 7/105* (2013.01); *H01L 2224/4848* (2013.01); *H01L 2224/48091* (2013.01); *H01L 2224/48465* (2013.01)

(58) Field of Classification Search
CPC ............. H01L 2224/48091; H01L 2224/4848; H01L 2224/48465; H01C 7/12; H01C 7/10; H01C 7/102; H01C 7/105
USPC .................................................. 361/104, 127
See application file for complete search history.

(56) References Cited

U.S. PATENT DOCUMENTS

| 3,670,221 | A | * | 6/1972 | Hamamoto et al. .............. 257/2 |
| 3,928,242 | A | | 12/1975 | May |
| 4,272,411 | A | * | 6/1981 | Sokoly et al. ................. 252/516 |
| 4,681,717 | A | * | 7/1987 | Brooks et al. ................. 264/617 |
| 5,248,452 | A | * | 9/1993 | Imai et al. ................. 252/519.52 |
| 5,818,677 | A | * | 10/1998 | Bennett et al. ................ 361/127 |
| 7,507,356 | B2 | * | 3/2009 | Yoshida et al. .......... 252/519.51 |
| 7,705,709 | B2 | | 4/2010 | Saito et al. |
| 8,704,210 | B2 | * | 4/2014 | Gao ............................... 257/15 |
| 2001/0002873 | A1 | * | 6/2001 | Tanaka ....................... 361/306.3 |

(Continued)

FOREIGN PATENT DOCUMENTS

| DE | 10 2007 014 300 | | 10/2007 |
| EP | 0 353 166 | | 1/1990 |
| EP | 0353166 | * | 1/1990 |
| EP | 1 580 809 | | 2/2005 |
| JP | 57-53909 | | 3/1982 |

(Continued)

*Primary Examiner* — Ronald W Leja
(74) *Attorney, Agent, or Firm* — Cozen O'Connor

(57) ABSTRACT

An electric component arrangement is described, comprising a semiconductor component (1) mounted on a varistor body (2). The varistor body is contact-connected to the semiconductor component for the protection thereof against electrostatic discharges and contains a composite material having as matrix a varistor ceramic and as filler a highly thermally conductive material being different from the varistor ceramic.

19 Claims, 4 Drawing Sheets

(56) References Cited

U.S. PATENT DOCUMENTS

| | | |
|---|---|---|
| 2001/0011766 A1 | 8/2001 | Nishizawa |
| 2004/0201941 A1* | 10/2004 | Harris et al. ............... 361/127 |
| 2005/0143262 A1* | 6/2005 | Hirose et al. ............... 505/100 |
| 2007/0075323 A1* | 4/2007 | Kanazawa et al. ........... 257/98 |
| 2007/0188963 A1 | 8/2007 | Saito et al. |
| 2007/0200133 A1* | 8/2007 | Hashimoto et al. .......... 257/100 |
| 2008/0068124 A1* | 3/2008 | Saito et al. ................... 338/51 |
| 2009/0026434 A1* | 1/2009 | Malhotra et al. ................ 257/2 |
| 2009/0256669 A1* | 10/2009 | Kosowsky et al. ............ 338/21 |
| 2011/0188161 A1* | 8/2011 | Feichtinger et al. ........... 361/52 |
| 2015/0144983 A1* | 5/2015 | Feichtinger et al. ........... 257/99 |

FOREIGN PATENT DOCUMENTS

| | | |
|---|---|---|
| JP | 58-171478 | 10/1983 |
| JP | 63-25902 | 2/1988 |
| JP | 63-296307 | 12/1988 |
| JP | 01-201993 | 8/1989 |
| JP | 05-014104 | 1/1993 |
| JP | 11 097215 | 4/1999 |
| JP | 2002-110405 | 4/2002 |
| JP | 2002-329872 | 11/2002 |
| JP | 2007-088173 | 4/2007 |
| JP | 2007 288140 | 11/2007 |

* cited by examiner

ELECTRIC COMPONENT ASSEMBLY

RELATED APPLICATIONS

This is a U.S. national stage of application No. PCT/EP2009/056247, filed on May 22, 2009.

This application claims the priority of German application no. 10 2008 024 479.1 filed May 21, 2008, the entire content of which is hereby incorporated by reference.

FIELD OF THE INVENTION

An arrangement of electric components, in particular with means for protection against overvoltages, is described.

BACKGROUND OF THE INVENTION

A device having a varistor and a light-emitting component is known from DE 10 2007 014 300 A1.

SUMMARY OF THE INVENTION

One object to be achieved is to provide a device or means with which an electric component can be protected against overvoltages with safeguarding care.

It is proposed that, in an electric component arrangement, a semiconductor component is mounted on a varistor body or is carried by the latter. The varistor body is electrically contact-connected to the electric component for the protection thereof. The semiconductor component and the varistor body are preferably electrically connected in parallel with one another.

The varistor body is formed as an independent mechanical unit and should be understood as a carrier of the semiconductor component. It can be produced separately from the semiconductor component and has a form which offers the semiconductor component a bearing or mounting area.

By means of the varistor body serving as a carrier for the semiconductor component, the semiconductor component is afforded a simple means for protection against overvoltages, in particular against electrostatic discharges, wherein the semiconductor component advantageously itself does not need to be developed or adapted for this purpose. The varistor body can be produced or designed for the purpose of the best possible protection against overvoltages of a semiconductor component coupled to the varistor body, separately without taking account of the design of the semiconductor component. The function of protection against overvoltages of the varistor body is thus permitted to be fully exploited without any restriction caused by the structure of the semiconductor component.

In accordance with one preferred embodiment of the component arrangement, the varistor body contains a composite material composed at least of a varistor ceramic and a highly thermally conductive material, wherein the highly thermally conductive material differs from the varistor ceramic, which is principally chosen for the nonlinear resistance function of the varistor body.

In accordance with one embodiment, the varistor ceramic is formed as main component or as matrix of the composite material and the thermally conductive material is formed as filler in said matrix. One example of a highly thermally conductive filler is a metal; in particular, metals having a thermal conductivity of greater than 100 W/(m*K) and noble metals of the 2nd and 3rd transition metal periods or the alloys thereof can be mentioned. The filler is preferably present as a distribution of highly thermally conductive particles in the varistor body.

A metal preferably which is present as filler in the varistor ceramic has the advantage of imparting a higher thermal conductivity to the varistor body, such that heat from the semiconductor component can also be dissipated via the varistor body. Consequently, the varistor body can have two functions simultaneously: that of protection against overvoltages and that of heat dissipation.

In one advantageous embodiment, the varistor body contains a highly thermally conductive ceramic that differs from the varistor ceramic or has a higher thermal conductivity than the varistor ceramic. Suitable ceramics have proved to be, for example, aluminum nitride, silicon carbide, hafnium oxide and manganese oxide, in particular also because they can be sintered well with a preferred varistor ceramic such as zinc oxide, for example, without undesirable crystalline interruptions being formed in the varistor body. The additional, highly thermally conductive ceramic can be present, in manner similar to that in the case of the metal, as filler in the varistor ceramic embodied as matrix.

The varistor body can be embodied as a multilayer varistor comprising a stack of varistor ceramic layers and internal electrode layers lying therebetween at least in regions. It is preferred for the multilayer varistor to be a sintered, monolithic multilayer component. As varistor ceramic of the individual layers, zinc oxide is chosen as main component whereas the internal electrodes can contain silver, palladium, platinum, copper, nickel or an alloy of these materials.

According to one embodiment, one or a plurality of layers of a varistor body embodied as a multilayer varistor can comprise zirconium oxide. In this case, it is preferred for at least the top layer of the multilayer varistor, on which the semiconductor component is mounted, to contain zirconium oxide. It is thereby possible to reduce the influences of stray capacitances of the multilayer varistor on the semiconductor component. If the multilayer varistor is integrated in a housing or the multilayer varistor lies on a printed circuit board, then it is preferred for the base layer also to contain zirconium oxide in order to achieve the same effect described above relative to the housing or the printed circuit board.

Instead of a multilayer varistor, a bulk varistor can serve as a carrier for the semiconductor component. It has external contacts of opposite polarities at its outer side, but is free of metallic layers internally.

In accordance with one embodiment, the varistor body has a plurality of electrical connections, of which at least one first electrical connection makes contact with the semiconductor component. Said electrical connection is preferably embodied as a metallic layer. The metallic layer can be applied on at least one region of the top side of the varistor body, for example by means of screen printing. The component arrangement is afforded a particularly compact form with an electrical connection embodied as a layer. However, other forms of electrical connections are conceivable, such as e.g. a contact wire.

In accordance with one embodiment of the component arrangement, the plurality of electrical connections of the varistor body comprise at least one second electrical connection which is separate from the first electrical connection and which makes contact with the varistor body toward the outside, so that the varistor is connected to a second electrical potential, isolated from the semiconductor component, by said second electrical connection. In this case, the second electrical connection can be contact-connected to a conductor track on a printed circuit board. A second electrical connection can be a ground connection, for example.

Both a first electrical connection and a second electrical connection can be embodied as metallic layers. Electrical connections of the varistor body which are embodied as metallic layers can contain at least one of the following materials: gold, nickel, chromium, palladium.

In accordance with one embodiment of the component arrangement, the second electrical connection, which makes contact with the varistor body toward the outside, is arranged on the underside of the varistor body, that is to say on the area lying perpendicularly opposite the mounting area of the semiconductor component. The second electrical connection can be embodied as a bond pad, for example. Said second electrical connection can be contact-connected to an electrically conductive structure of a printed circuit board or of a housing. The second electrical connection can furthermore comprise a contact wire, wherein the latter can be connected, for example, to a bond pad comprised by the electrical connection. Moreover, one embodiment provides for the second electrical connection to be arranged in a manner spaced apart from the first electrical connection on the top side of the varistor body.

It is preferred for the semiconductor component to have a flip-chip contact-connection on its mounting side or underside. The flip-chip contact-connection can have an arrangement or an array of solder balls on the underside of the semiconductor component.

One embodiment provides for the first electrical connection of the varistor body, which makes contact with the semiconductor component, simultaneously to form a contact of the varistor body toward the outside, if appropriate using a contact wire used with the first electrical connection.

In accordance with one embodiment, the varistor body has at least one internal electrode that can serve for tuning the capacitance of the varistor body. The internal electrode can be a ground electrode that dissipates overvoltages or current surges through the varistor or from the varistor body. The internal electrode is connected to at least one electrical connection of the varistor body. By way of example, the internal electrode can be connected to the at least one electrical connection by means of at least one plated-through hole, which can also be termed as a via.

In accordance with one embodiment, several internal electrodes are present in the varistor body and make contact with different electrical connections of the varistor body. In this case, it is preferred for said electrodes to be separated from one another by means of a varistor ceramic or by means of a dielectric and to have overlap areas, by means of which capacitances can be produced. In accordance with one embodiment, the internal electrodes run perpendicularly to the mounting area of the semiconductor component.

In accordance with one embodiment of the component arrangement, the varistor body has at least one thermally conductive channel through which heat can be dissipated from the semiconductor component. The thermally conductive channel is preferably embodied as a hole filled with a highly thermally conductive material. It can run as a metallic path between the top side and the underside of the varistor body. In this case, it can be embodied substantially in pin-type fashion. However, the thermally conductive channel can also be embodied as a ceramic path having a high thermal conductivity, wherein said ceramic path or the ceramic of the path has a higher thermal conductivity compared to the surrounding material of the varistor body.

Preference is given to a component arrangement comprising a housing having at least one electrically conductive part or region which is contact-connected to the varistor body and/or to the semiconductor component. The housing carries the varistor body, wherein the semiconductor component and the varistor body are connected in parallel with the electrically conductive part of the housing. The electrically conductive part of the housing can be embodied as a metallic layer, for example as a conductor track. The electrically conductive part of the housing preferably contains aluminum or copper.

In the case of a highly thermally conductive embodiment of the varistor body, the latter serves as a thermomechanical buffer between the semiconductor component and the housing.

In accordance with one embodiment, the housing has at least one thermally conductive region which is thermally coupled to the varistor body. As a result, heat taken up by the varistor body can be dissipated by the housing. In this case, said region can comprise a highly thermally conductive material such as, for example, a highly thermally conductive ceramic or a metal.

In accordance with one expedient embodiment of the component arrangement, it additionally comprises a thermistor connected to the semiconductor component. Depending on its resistance/temperature characteristic curve, the thermistor contributes to the regulation of the control current of the semiconductor component, such that it can be operated with safeguarding care. In accordance with one embodiment, the thermistor is mounted on the varistor body, but need not be so mounted. Instead, it could, for example, be integrated alongside the varistor body in a common housing. The thermistor can be connected to an analyzing unit, which uses measured values of the thermistor in order to regulate the current that feeds the semiconductor component. The control current is regulated in such a way that the LED is not exposed to any current surges or is operated with as far as possible constant alternating current (AC).

The semiconductor component can be chosen from a multitude of components. It can be an optoelectronic component, such as e.g. an LED, a capacitor or a multilayer capacitor, a thermistor or a multilayer thermistor having PTC or NTC properties, a diode or an amplifier. At all events, the varistor body is able to protect the semiconductor component carried by it against overvoltages with safeguarding care, and it is even able, according to some embodiments described in this document, to dissipate heat from the semiconductor component. An LED as semiconductor component is preferably composed of one or more of the following materials: gallium phosphide (GaP), gallium nitride (GaN), gallium arsenide phosphide (GaAsP), aluminum gallium indium phosphide (AlGaInP), aluminum gallium phosphide (AlGaP), aluminum gallium arsenide (AlGaAs), indium gallium nitride (InGaN), aluminum nitride (AlN), aluminum gallium indium nitride (AlGaInN), zinc selenide (ZnSe).

BRIEF DESCRIPTION OF THE DRAWINGS

The subject-matters described will be explained in greater detail with reference to the following figures and exemplary embodiments. In the figures.

DETAILED DESCRIPTION OF THE DRAWINGS

Figure 1:
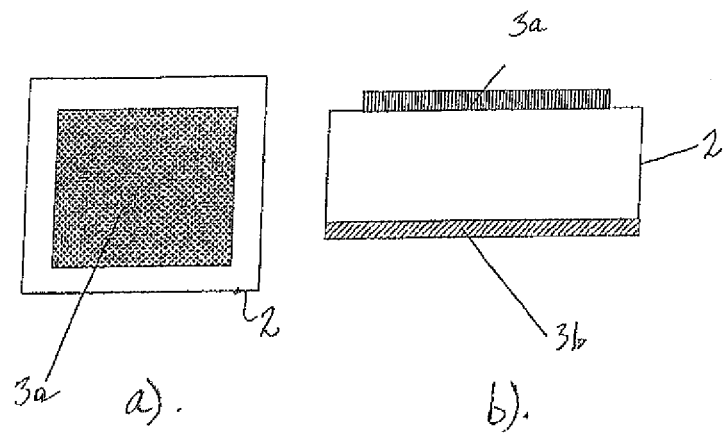
FIG. 1a shows a plan view of a component arrangement with a first arrangement of electrical connections.
FIG. 1b shows a cross-sectional view of the component arrangement shown by FIG. 1a, FIG. 2 shows a cross-sectional view of a component arrangement with a housing with a first electrical interconnection.

FIG. 1a shows a plan view of a varistor body 2 serving as a carrier for a semiconductor component, for example an LED, said varistor body having a contact layer 3a on its top side, said contact layer serving for making contact with the semiconductor component. The contact layer 3a can be an anode contact. It is preferred for said contact layer to contain gold, preferably in terms of principal proportion. The varistor body 2 can have a thickness of between 90 and 100 µm. Zinc oxide is preferably used as varistor ceramic for the varistor body.

FIG. 1b shows how the varistor body 2 in accordance with FIG. 1a is provided, on its underside, with a second electrical connection 3b, which is embodied as a contact layer and which can serve as a cathode or ground contact, for example. In this case, it is preferred for the lower contact layer 3b to be one which contains aluminum, preferably in terms of the principal proportion. The contact layer 3b preferably serves for making contact with the varistor body 2 toward the outside, for example for making contact with a housing or with the electrically conductive part thereof.

The ceramic of the varistor body preferably consists, in terms of the principal proportion, of a composite material comprising a varistor ceramic as matrix and a metal as filler. As varistor ceramic or as matrix, zinc oxide or the mixture zinc oxide-bismuth (Bi)-antimony (Sb) or the mixture zinc oxide-praseodymium (Pr) can be used, wherein, in contrast to the metal filler described below, the metals or metalloids bismuth, antimony or lead that are bonded to the zinc oxide are not present as particles separate from the matrix. The metal present as filler is preferably chosen from silver (Ag), palladium (Pd), platinum (Pt), tungsten (W), alloys of said elements or mixtures of the abovementioned substances. Appropriate alloys include alloys of the abovementioned metals among one another and/or with other elements; silver-palladium alloys should be mentioned by way of example. Metal particles preferably distributed stochastically in the varistor ceramic should be understood as filler, said metal particles can in each case consist of metal compounds. A distribution of particles that is as homogeneous as possible is preferred.

Figure 2:
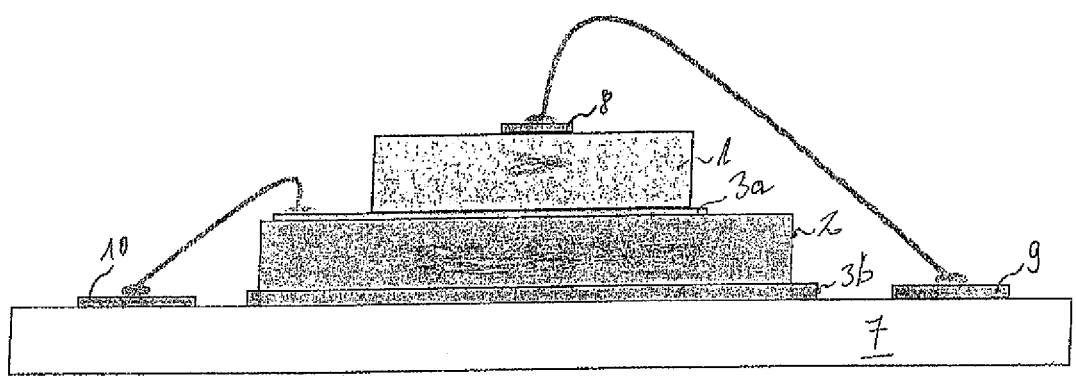

FIG. 2 shows a cross-sectional view of an optoelectronic component arrangement, wherein an LED 1 as semiconductor component is mounted on a varistor body 2. The component arrangement comprises a housing 7, one part of which is illustrated. The varistor body 2 is mounted on the housing 7 or is carried by the latter. The varistor body 2 is contact-connected to an electrically conductive part of the housing 7 by means of a ground connection 3b embodied as a layer, preferably containing aluminum. On the top side, the varistor body 2 is contact-connected to the LED 1 by means of an anode contact 3a embodied as a layer, or by means of a first electrical connection. On the top side, the LED is provided with a cathode contact 8 embodied as a layer or bond pad. The cathode contact 8 has a contact wire connected to the bond pad, said contact wire producing an electrical connection to the corresponding cathode contact 9 of the housing 7. The cathode contact 9 of the housing can be embodied as a conductor track. Moreover, the housing has an anode contact 10, which is for example embodied as a conductor track and which is electrically conductively connected to the anode contact 3a between the varistor body 2 and the LED 1 by means of a contact wire. The first electrical connection 3a has an area that is kept free of the semiconductor component, this area provides space for making contact with the varistor body toward the outside on the same top side of said varistor body.

Figure 3:
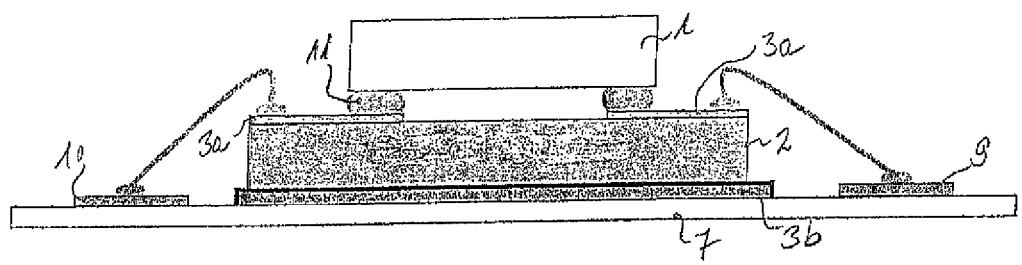
FIG. 3 shows a cross-sectional view of a component arrangement with a housing with a second electrical interconnection.

FIG. 3 shows a cross-sectional view of an optoelectronic component arrangement wherein an LED 1 as semiconductor component is mounted on a varistor body 2, wherein the LED has a flip-chip contact-connection 11 on its underside. On the top side, the varistor body 2 has two electrical connections 3a and 3b as anode contact and as cathode contact, said electrical connections being spaced apart from one another. The varistor body 2 is contact-connected to the flip-chip contact-connection 11 of the LED 1 by means of said connections 3a and 3b, which are each embodied as metallic layers. The component arrangement comprises a housing 7, one part of which is illustrated in the figure, wherein the electrical connections 3a of the varistor body 2 are connected to corresponding contacts 9 and 10 of the housing 7. The varistor body 2 is contact-connected to an electrically conductive part of the housing 7 by means of a ground connection 3b—embodied as a layer, preferably containing aluminum—as second electrical connection.

Figure 4:
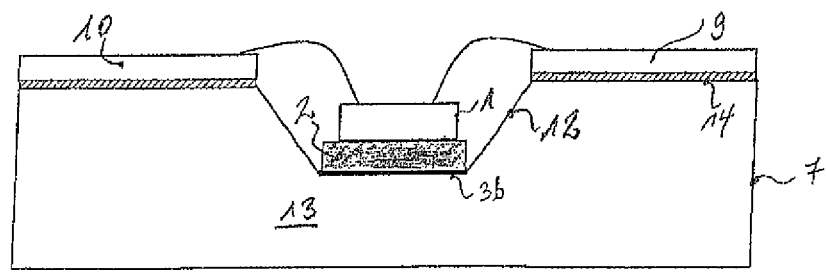
FIG. 4 shows a cross-sectional view of a component arrangement with a first electrical interconnection with a housing.

FIG. 4 shows a cross-sectional view of a component arrangement wherein an LED 1 is mounted on a varistor body 2, wherein an anode connection and a cathode connection (not shown) on the underside of the LED contact-connect the latter to the varistor body 2. For its part, the varistor body is carried by a housing 7 having a recess 12 or depression, into which the varistor body 2 with the LED 1 carried by it can be arranged. The LED and the varistor body are accordingly integrated in the housing. On the top side, the LED has two electrical connections, each having a contact wire. The contact wires in each case make contact with a corresponding electrically conductive anode part 9 and cathode part 10, respectively, of the housing. On its underside, the varistor body 2 is provided with a ground connection 3b, which makes contact with a ground contact 13 of the housing 7, said ground contact being insulated from the anode part 9 and cathode part 10 of the housing. The insulation is effected by means of an insulating layer 14, which can be embodied as part of the housing.

In the case where an LED as semiconductor component is carried by the varistor body 2, that surface of the housing 7 which faces the LED, in particular the inner area of the recess 12, is preferably provided with a reflective layer that improves the total coupling-out of the light emitted by the LED. For the same purpose, an exposed surface of the varistor body can likewise be provided with a reflective layer.

Figure 5:
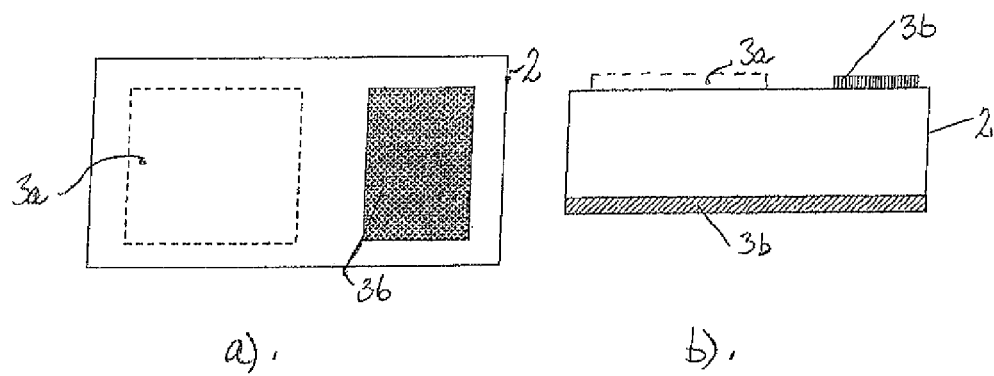
FIG. 5a shows a plan view of a component arrangement with two separate electrical connections on the top side.
FIG. 5b shows a cross-sectional view of the component arrangement presented by FIG. 5a, FIG. 6 shows a cross-sectional view of a component arrangement with a housing having a recess.

FIG. 5a shows a plan view of a component arrangement wherein two electrical connections 3a and 3b, which are separated from one another, are arranged or in each case applied as an electrically conductive layer on the top side of the varistor body 2. The first electrical connection 3a, which is shown as a dashed frame, makes contact with a semiconductor component 1 mounted on the varistor body 2, wherein said semiconductor component, for its part, has an electrical connection of opposite polarity relative to the electrical connection 3a, for example on its top side (in this respect, also see FIG. 6, for example). Separately from and alongside said first electrical connection 3a, a second electrical connection 3b is likewise arranged on the top side of the varistor body 2, said second electrical connection contact-connecting the varistor body 2 toward the outside, for example to an electrically conductive part 9 of the housing. The second electrical connection 3b preferably has a contact wire alongside the metallic layer applied on the varistor body, said contact wire electrically contact-connecting the varistor to the housing 7.

FIG. 5b shows a cross-sectional view of the component arrangement in accordance with FIG. 5a and, in particular, additionally the ground connection 3b on the underside of the component arrangement.

Figure 6:
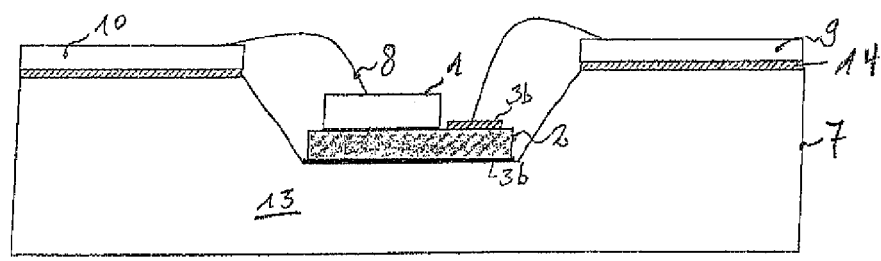

FIG. 6 shows an optoelectronic component arrangement wherein a varistor body 2 carrying a semiconductor component 1 such as e.g. an LED is integrated in the recess or depression 12 of a housing 7. The electrical connections of the varistor body 2 are embodied in accordance with the description concerning FIGS. 5a and 5b. The recess 12 preferably has a reflective coating on its surface exposed to the light from the LED. The total coupling-out of light from the component arrangement can thereby be increased. The ground connection 3b of the varistor body is contact-connected to a corresponding ground connection 13 of the housing 7, said ground connection is electrically decoupled from the cathode connection 9 and from the anode connection 10 by means of the insulating layer 14. That region of the housing which has the recess 12 can be the region of its ground connection 13. Said region could consist, for example, of a metal such as e.g. copper or aluminum. In particular, a metal is preferred which is electrically conductive with low resistance and has a high reflectivity for improved coupling-out of light.

Preferably, the varistor body 2 is mechanically connected to a highly thermally conductive region of the housing, but at all events is thermally coupled to it in order that the housing can dissipate heat taken up by the varistor body, said heat originating from or being emitted by the varistor body 2 and/or by the semiconductor component 1, further toward the outside.

Figure 7:
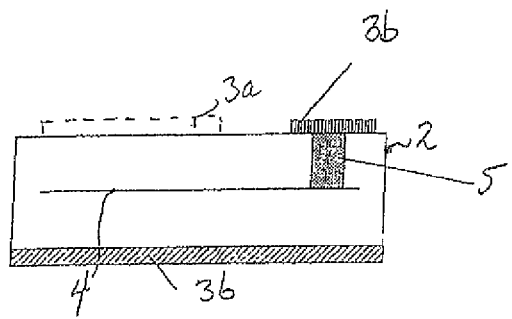
FIG. 7 shows a cross-sectional view of a component arrangement with a top side in accordance with FIGS. 5a and 5b, wherein the varistor body has an internal electrode and a plated-through hole.

FIG. 7 shows a cross-sectional view of a component arrangement wherein the varistor body 2 has an internal electrode 4, which extends within the varistor body parallel to the bearing area of the semiconductor component and is connected to a plated-through hole 5. The edges of the internal electrode 4 remain within the varistor body; they do not extend as far as the edge of said varistor body. Apart from its contact-connection to the plated-through hole 5, the internal electrode should be considered to be "floating". The plated-through hole or the via 5 electrically connects the internal electrode 4 to the second electrical connection 3b on the top side of the varistor body. The plated-through hole can be provided by a hole filled with a metal in the varistor body. It preferably comprises a material in common with the second electrical connection 3b and with the internal electrode 4. A ground connection 3b is shown on the underside of the varistor body 2.

The varistor body 2 has a varistor-ceramic layer stack, wherein the internal electrode is arranged between two adjacent layers of the stack.

Figure 8:
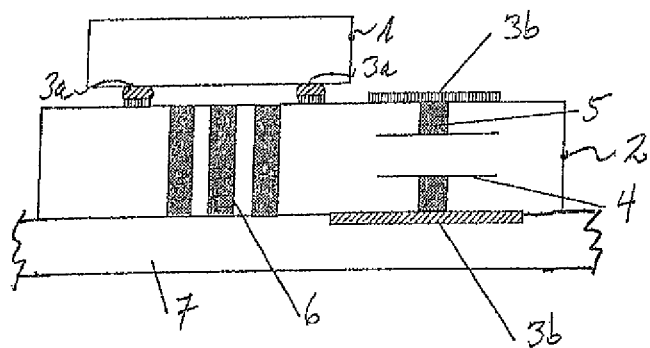
FIG. 8 shows a cross-sectional view of a component arrangement with a varistor body with a top side in accordance with FIGS. 5a and 5b, wherein a semiconductor component and a varistor body with thermally conductive channels and a plurality of internal electrodes are additionally shown.

In the component arrangement in accordance with FIG. 8, the varistor body 2 has a plurality of thermally conductive channels 6, which can also be referred to as thermal vias. They run alongside one another perpendicularly to the bearing area of the semiconductor component 1 on the varistor body 2 and extend from there as far as the underside of the varistor body or as far as the base area thereof. The thermal vias can be embodied as perpendicular holes in the varistor body that are filled with a highly thermally conductive material. The thermal vias 6 can in each case comprise metals. According to one embodiment, however, they comprise a highly thermally conductive ceramic, in particular a ceramic having a higher thermal conductivity than that of the surrounding material. They can likewise comprise a mixture composed of a metal and a highly thermally conductive ceramic. Instead of a plurality of thermal vias 6, a single thermal via 6 could also extend from the top side as far as the underside of the varistor body 2.

Thermal vias as shown by this figure can be present in the varistor body in all embodiments of the component arrangement that are described in this document.

FIG. 8 additionally shows that laterally alongside the thermal vias 6 (relative to the bearing area of the semiconductor component) a plurality of internal electrodes 4 arranged one above another are present in the varistor body, which are in each case connected to a plated-through hole 5. In this case, a first internal electrode 4 is electrically connected by means of a plated-through hole 5 to the ground connection 3b on the underside of the varistor body 2, and the second internal electrode is contact-connected by means of a further plated-through hole 5 to an electrical connection 3b which contact-connects the varistor body toward the outside and which can be arranged for example on the top side of the varistor body. Varistor material is present between the internal electrodes. The internal electrodes run parallel to the mounting area of the semiconductor component 1 on the varistor body; the plated-through holes 5 run perpendicularly to the internal electrodes. In this case, the varistor body 2 likewise has a varistor-ceramic layer stack, wherein at least one internal electrode is arranged between two adjacent layers.

Figure 9:
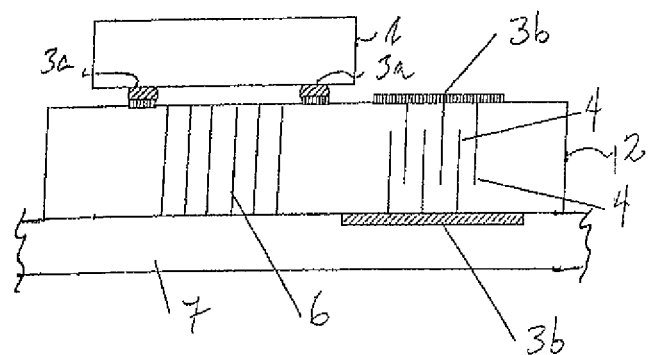
FIG. 9 shows a cross-sectional view of a component arrangement in accordance with FIG. 8 with alternative thermally conductive channels and internal electrodes.

FIG. 9 shows a multilayer varistor body 2 lying on its longitudinal side, wherein metal structures are present between adjacent varistor-ceramic layers. Thin metallic layers run below the semiconductor component 1 mounted on the upper longitudinal side of the multilayer varistor body, said layers dissipate the heat from the semiconductor component to the housing 7. Internal electrodes 4 are connected to the second electrical connections 3b of the multilayer varistor body 2, one of said connections being a ground connection, wherein a first set of internal electrodes are in each case contact-connected to the ground connection, and a second set of internal electrodes are in each case contact-connected to the further electrical connection 3b. In the stacking direction, an internal electrode 4 of the first set is in each case adjacent to an internal electrode 4 of the second set. The internal electrodes have overlapping areas in the stacking direction of the multilayer varistor body (in orthogonal projection). Between these overlapping areas of the internal electrodes it is possible to produce capacitances with the varistor ceramic as dielectric. The thermally conductive metallic structures 6 below the semiconductor component and also the internal electrodes 4 run perpendicularly to the bearing area of the semiconductor component.

In an embodiment in accordance with FIG. 9, it is particularly advantageous that both the thermally conductive tracks 6 and the internal electrodes 4 can be printed onto varistor-ceramic layers in the same way, which significantly reduces the production outlay of the component arrangement.

Exemplary embodiments described in the context of this document should be understood such that each varistor body can contain a composite material composed of a varistor ceramic as main component or as matrix and a highly thermally conductive material as filler. In a multilayer varistor, individual or all varistor-ceramic layers can have such a composition.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An electric component arrangement, comprising:
a housing defining a recess having a surface exposable to light;
a reflective coating on the surface of the recess;
a varistor body; and
at least one semiconductor component mounted on the varistor body, the varistor body and the at least one semiconductor component being carried by the housing within the recess;
wherein the varistor body is contact-connected to the semiconductor component for the protection thereof against electrostatic discharges, and wherein the varistor body contains a composite material having as matrix a varistor ceramic and as filler particles of a thermally conductive material different from the varistor ceramic and distributed in the varistor ceramic.

2. The component arrangement according to claim 1, wherein the varistor body has a plurality of electrical connections, of which at least one first electrical connection makes contact with the semiconductor component.

3. The component arrangement according to claim 2, wherein the plurality of electrical connections of the varistor body comprise a second electrical connection, which is separate from the first electrical connection and which makes contact with the varistor body toward the outside.

4. The component arrangement according to claim 3, wherein the second electrical connection is arranged on the underside of the varistor body.

5. The component arrangement according to claim 3, wherein the semiconductor component is mounted on a top side of the varistor body, the first electrical connection and the second electrical connection are located on the top side of the varistor body, and wherein the varistor body further comprises a ground connection on its underside.

6. The component arrangement according to claim 1, wherein the semiconductor component is flip-chip contact-connected to the varistor body.

7. The component arrangement according to claim 2, wherein the varistor body has at least one internal electrode connected to an electrical connection.

8. The component arrangement according to claim 7, wherein the internal electrode is connected to the electrical connection by means of at least one plated-through hole.

9. The component arrangement according to claim 7, wherein a plurality of internal electrodes make contact with different electrical connections of the varistor body and have joint overlap areas.

10. The component arrangement according to claim 1, wherein the varistor body has at least one thermally conductive channel through which heat can be dissipated from the semiconductor component.

11. The component arrangement according to claim 10, wherein the thermally conductive channel contains a material chosen from a metal and a thermally conductive ceramic.

12. The component arrangement according to claim 1, wherein the varistor body with the semiconductor component mounted on it are integrated in the housing, and wherein the housing has a thermally conductive region connected to the varistor body and which is thermally coupled to the varistor body.

13. The component arrangement according to claim 1, wherein the varistor body and the semiconductor component are connected in parallel.

14. The component arrangement according to claim 1, wherein the semiconductor component is chosen from: an LED, a capacitor, a thermistor, a diode, an amplifier, and a transformer.

15. The component arrangement according to claim 1, additionally comprising a thermistor which contributes, depending on its resistance/temperature characteristic curve, to the regulation of the control current of the semiconductor component.

16. The component arrangement according to claim 1, wherein the varistor ceramic forming the matrix is selected from zinc oxide, the mixture zinc oxide-bismuth (Bi)-antimony (Sb) or the mixture zinc oxide-praseodymium (Pr).

17. The component according to claim 1, wherein the selected filler is aluminum nitride.

18. The component according to claim 1, wherein the selected filler is hafnium oxide.

19. The component according to claim 1, wherein the filler is selected from metals having a thermal conductivity of greater than 100 W/(m*K), noble metals of the $2^{nd}$ and $3^{rd}$ transition metal periods or the alloys thereof, silicon carbide, or manganese oxide.

* * * * *